United States Patent [19]

Morris

[11] 4,092,211
[45] May 30, 1978

[54] CONTROL OF ETCH RATE OF SILICON DIOXIDE IN BOILING PHOSPHORIC ACID

[75] Inventor: John David Morris, Ottawa, Canada

[73] Assignee: Northern Telecom Limited, Montreal, Canada

[21] Appl. No.: 742,759

[22] Filed: Nov. 18, 1976

[51] Int. Cl.² .......................................... H01L 21/308
[52] U.S. Cl. ..................... 156/644; 156/653; 156/657; 156/662; 252/79.2
[58] Field of Search ............... 156/623, 657, 659, 662, 156/653, 642; 252/79.2, 146

[56] References Cited

U.S. PATENT DOCUMENTS

| | | | |
|---|---|---|---|
| 3,479,237 | 11/1969 | Bergh et al. | 156/653 |
| 3,607,480 | 9/1971 | Harrap et al. | 156/657 |
| 3,764,423 | 10/1973 | Hauser et al. | 156/653 |
| 3,788,915 | 1/1974 | Gulla | 156/642 |
| 3,808,069 | 4/1974 | Caffrey et al. | 156/657 |
| 3,839,534 | 10/1974 | Matsumoto et al. | 156/642 |
| 3,871,931 | 3/1975 | Godbar | 156/662 |
| 3,951,711 | 4/1976 | Snyder | 156/642 |
| 3,966,517 | 6/1976 | Claes et al. | 252/79.3 |

*Primary Examiner*—David Klein
*Assistant Examiner*—Jerome W. Massie
*Attorney, Agent, or Firm*—S. T. Jelly

[57] ABSTRACT

The etch rate of silicon dioxide, particularly thermally grown silicon dioxide, in boiling phosphoric acid, can be controlled by deliberately adding additional silicate to the acid. For thermally grown silicon dioxide, the etch rate can be reduced from about 5A per minute with no added silicate, to about 0.5A/minute with 1 gram of added silicate to about 1 liter of acid.

4 Claims, 2 Drawing Figures

CONTROL OF ETCH RATE OF SILICON DIOXIDE IN BOILING PHOSPHORIC ACID

This invention relates to the control of etch rate of silicon dioxide in boiling phosphoric acid, and particularly to the substantial reduction in etch rate of thermally grown silicon dioxide when used as a masking material.

Boiling phosphoric acid is used for etching silicon nitride ($Si_3N_4$). However, when it is desired to etch predetermined patterns in $Si_3N_4$, as in the production of semi-conductor devices, it is necessary to mask the $Si_3N_4$ prior to etching. However, photoresist masking materials are not resistive to etching by boiling phosphoric acid and usually $SiO_2$ is used as a masking material.

The etch rate of $SiO_2$ in boiling phosphoric acid is still quite high — typically approximately 5A/minute. To ensure satisfactory etching of the underlying $Si_3N_4$ layer, it is usual to grow a 100A layer of $SiO_2$, or thicker, but even then it is possible that the $SiO_2$ layer will be completely removed — at least in some areas, with undesirable etching of the $Si_3N_4$. Thick layers of masking $SiO_2$ are time consuming in production and reduce the resolution available.

The present invention provides for the reduction in etch rate of $SiO_2$ in boiling phosphoric acid by the addition of a material to the phosphoric acid which will increase the silicate content of the acid above the normal levels of impurity.

The invention will be readily understood by the following description of certain embodiments, by way of example, in conjunction with the accompanying drawings in which.

Figure 1:
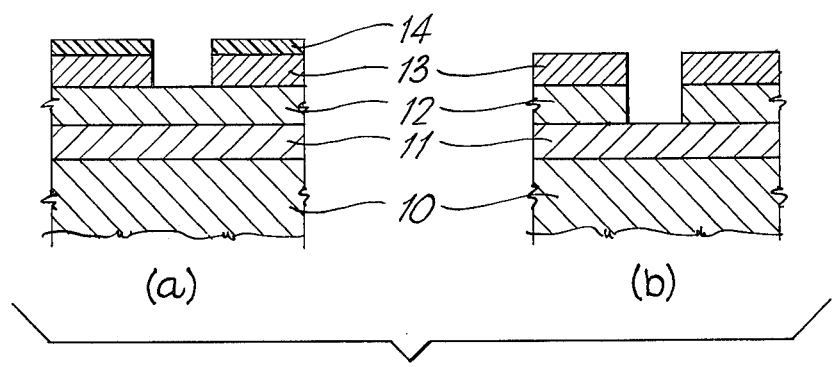
FIG. 1 is a diagrammatic cross-section through a semiconductor device illustrating the steps in etching $Si_3N_4$.

Considering FIG. 1(a), there is illustrated a silicon substrate 10, a layer of $SiO_2$, 11 on the substrate, a layer of $Si_3N_4$, 12, on the oxide layer 11 and a layer of thermally grown $SiO_2$, 13, on the $Si_3N_4$ layer 12. The oxide layer 13 is intended to act as a mask for etching the $Si_3N_4$ layer 12 and in FIG. 1(a) a photoresist mask 14 has been applied and the $SiO_2$ layer 13 etched through this mask down to the $Si_3N_4$ layer 12, in a conventional manner for example etching in hydrofluoric acid solution.

The photoresist layer or mask 14 is removed and the $Si_3N_4$ layer 12 etched through the $SiO_2$ masking layer 13 in boiling phosphoric acid. This is illustrated in FIG. 1(b). In conventional processes the $SiO_2$ masking layer 13 is partly removed — and may in some cases by completely removed, with loss of the desired pattern in the $Si_3N_4$ layer.

The etch rate of thermally grown $SiO_2$ used for masking purposes is approximately 5A/minute in boiling phosphoric acid (180° C). To ensure that mask failure does not occur during the nitride etching process it is desirable to reduce the $SiO_2$ etch rate, for example to less than 2A/minute although slightly higher etch rates can still be useful. The etch rate is decreased, in accordance with the present invention, by increasing the silicate content of the phosphoric acid. Phosphoric acid is what is termed a "dirty" acid, and contains several impurities, including silica. The present invention increases the silicate content substantially above that which may occur in the commercially available product.

Two ways of increasing the silicate content are (1) adding a soluble silicate, for example sodium metasilicate, to the phosphoric acid; (2) introducing a large surface area of $SiO_2$ into the boiling phosphoric acid, as by adding finely divided silica powder, silica fibre, or silicic acid (a hydrated of silica).

Sodium metasilicate has the advantage of being soluble in the phosphoric acid but the resulting presence of sodium in the etchant may be undesirable for some purposes because of its possible effect — on device stability for example. The addition of finely divided silica or silicic acid is an effective and acceptable alternative. The large surface area of the $SiO_2$ of the added material presented to the boiling acid results in the required increase in the silicate content of the phosphoric acid very quickly, for example in less than ½ hour.

As an example, 2 grams of sodium metasilicate or 1 gram of finely divided silica or silicic acid per liter of phosphoric acid will decrease the $SiO_2$ etch rate from about 5A/minute to about 0.4A/minute. The etch rate of the silicon nitride is not significantly affected by the increased silicate content of the phosphoric acid.

Figure 2:
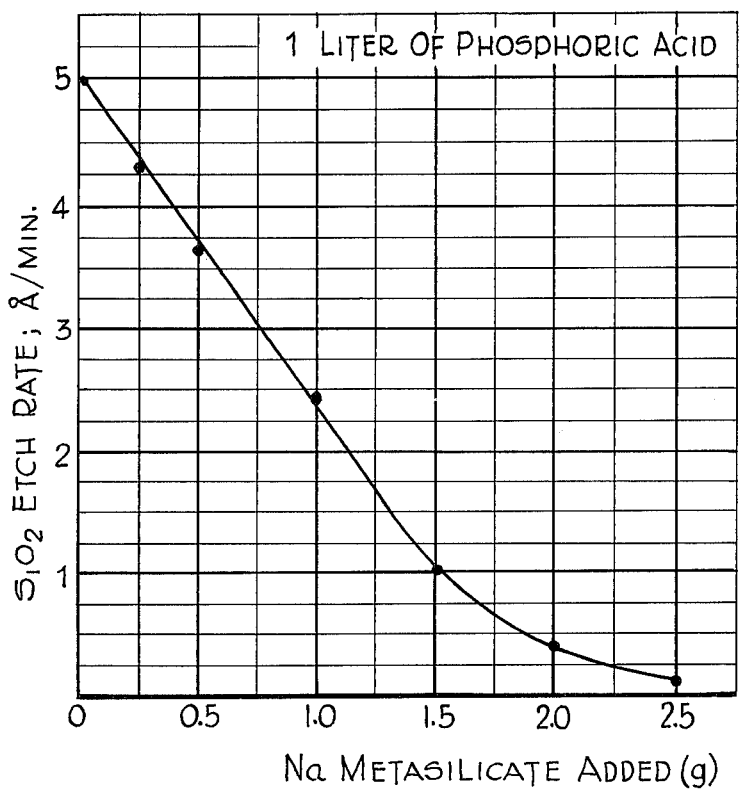
FIG. 2 is a curve representative of the variation in etch rate of $SiO_2$ with variation in effective silicate added to the etch solution.

FIG. 2 is a curve which illustrates the effect of increasing the silicate content of phosphoric acid etchant on the etch rate of thermally grown $SiO_2$. The particular curve of FIG. 2 was obtained by adding sodium metasilicate to the phosphoric acid, the particular example being of approximately 1 liter of acid, the etch rate, in boiling phosphoric acid being at about 5A per minute with no additional silicate added by addition of sodium metasilicate down to about 0.35A/0.40A per minute with 2.0 grams of sodium metasilicate, and with a further reduction to about 0.15A/minute with 2.5 grams of sodium metasilicate added. Depending upon any particular batch of phosphoric acid, the reduction in etch rate, illustrated in FIG. 2, can vary, FIG. 2 itself being a curve of the mean values for a number of tests. A particularly useful range would be that produced by adding between about 0.70 and 2.5 grams of sodium metasilicate. This corresponds to from about 0.30 to about 1.25 gram of silicate added to the acid, giving an etch rate from about 3.0A/minute to about 0.15A/minute. A value of around 0.5A per minute is a good general rate. As stated, other ways of adding silicate to the acid can be used. In some cases it is not readily ascertainable what amount of silicate is actually added to the acid from the particular additive material used, but if necessary it can be ascertained by chemical testing. However it is soon ascertained, by actual results, what desirable amounts of additive are needed to give a particular etch rate: that is the amount of actual silicate added.

Use of the invention enables thinner $SiO_2$ masking layers to be used without the risk of mask failure, giving reduced costs and providing improved resolution.

What is claimed is:

1. In a process for etching silicon nitride through apertures in a silicon dioxide mask in boiling phosphoric acid, the method of substantially reducing the etch rate of the silicon dioxide mask with substantially no reduction in the etch rate of the silicon nitride comprising adding material containing silicate to commercial quality phosphoric acid to add between about 0.30 and 1.25 grams of silicate per liter of phosphoric acid.

2. A method as claimed in claim 1, comprising the addition of a soluble silicate.

3. A method as claimed in claim 2, wherein the material added is sodium metasilicate, between about 0.7 gram and 2.5 grams of sodium metasilicate per liter of acid etch solution.

4. A method as claimed in claim 1, comprising the addition of finely divided silica containing material.

* * * * *